United States Patent
Rofougaran

(10) Patent No.: US 7,782,145 B2
(45) Date of Patent: Aug. 24, 2010

(54) METHOD AND SYSTEM FOR FREQUENCY TUNING BASED ON CHARACTERIZATION OF AN OSCILLATOR

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 4 days.

(21) Appl. No.: 12/057,743

(22) Filed: Mar. 28, 2008

(65) Prior Publication Data

US 2009/0243742 A1 Oct. 1, 2009

(51) Int. Cl.
*H03B 5/08* (2006.01)

(52) U.S. Cl. .......................... 331/47; 331/36 C; 331/48

(58) Field of Classification Search ............... 331/36 C, 331/44, 46, 47, 48, 50, 111, 143; 327/182, 327/552–554
See application file for complete search history.

(56) References Cited

U.S. PATENT DOCUMENTS

| | | | |
|---|---|---|---|
| 5,130,671 A | 7/1992 | Shahriary et al. | |
| 6,069,505 A * | 5/2000 | Babanezhad | ................ 327/156 |
| 6,198,353 B1 | 3/2001 | Janesch et al. | |
| 6,366,174 B1 | 4/2002 | Berry et al. | |
| 6,628,163 B2 * | 9/2003 | Dathe et al. | .................. 327/553 |
| 6,842,710 B1 * | 1/2005 | Gehring et al. | ............. 702/107 |
| 7,046,098 B2 | 5/2006 | Staszewski | |
| 7,356,423 B2 * | 4/2008 | Nehrig | ........................ 702/75 |
| 2005/0253646 A1 * | 11/2005 | Lin | ............................. 327/553 |
| 2008/0258806 A1 * | 10/2008 | Youssoufian et al. | ........ 327/553 |

* cited by examiner

*Primary Examiner*—Robert Pascal
*Assistant Examiner*—Levi Gannon
(74) *Attorney, Agent, or Firm*—McAndrews, Held & Malloy, Ltd.

(57) ABSTRACT

Aspects of a method and system for frequency tuning based on characterization of an oscillator are provided. In this regard, a frequency of an oscillator in an integrated circuit may be controlled based on a first digital control word, a frequency of a tuned circuit may be controlled based on a second digital control word, and the second control word may be determined utilizing a mapping between the first control word and the second control word. The frequency of the oscillator and the tuned circuit may be controlled by adjusting a capacitance of the oscillator and tuned circuit, respectively. The mapping may be based on a relationship between the oscillator and the tuned circuit, such as logical and/or mathematical relationship between the capacitance of the oscillator and the capacitance of the tuned circuit and/or the relationship between the frequency of the oscillator and the frequency of the tuned circuit.

27 Claims, 6 Drawing Sheets

METHOD AND SYSTEM FOR FREQUENCY TUNING BASED ON CHARACTERIZATION OF AN OSCILLATOR

CROSS-REFERENCE TO RELATED APPLICATIONS/INCORPORATION BY REFERENCE

Not applicable.

FIELD OF THE INVENTION

Certain embodiments of the invention relate to signal processing. More specifically, certain embodiments of the invention relate to a method and system for frequency tuning based on characterization of an oscillator.

BACKGROUND OF THE INVENTION

With the rapidly increasing dependence on electronic communications and the accompanying efforts to make these communications smaller, faster, and cheaper, the complexity of designing communications systems is also increasing. At least for these reasons, electronics designers are continually trying to fit more functionality into smaller and smaller packages, and although this increased integration may lead to smaller and more desirable products, it may also greatly increase the amount of effort required for designing and testing such systems. For example, variations in fabrication processes may result in integrated systems exhibiting significant differences in performance between lots and even between wafers. Accordingly, ways for tuning and/or characterizing integrated systems are needed in order to provide consistent performance.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for frequency tuning based on characterization of an oscillator, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for frequency tuning based on characterization of an oscillator. In this regard, a frequency of an oscillator in an integrated circuit may be controlled based on a first digital control word and a frequency of a tuned circuit may be controlled based on a second digital control word, where the second control word may be determined utilizing a mapping between the first control word and the second control word. The frequency of the oscillator and the tuned circuit may be controlled by adjusting a capacitance of the oscillator and tuned circuit, respectively. The capacitance may be adjusted via a configurable bank of capacitors. The frequency of the oscillator may be measured and/or verified via a phase locked loop. The mapping may be based on a relationship between the oscillator and the tuned circuit, such as logical and/or mathematical relationship between the capacitance of the oscillator and the capacitance of the tuned circuit and/or the relationship between the frequency of the oscillator and the frequency of the tuned circuit. One or more look-up tables may be utilized to implement the mapping between the first digital control word and the second control word. In various embodiments of the invention, the tuned circuit may be an oscillator or a filter.

Figure 1A:
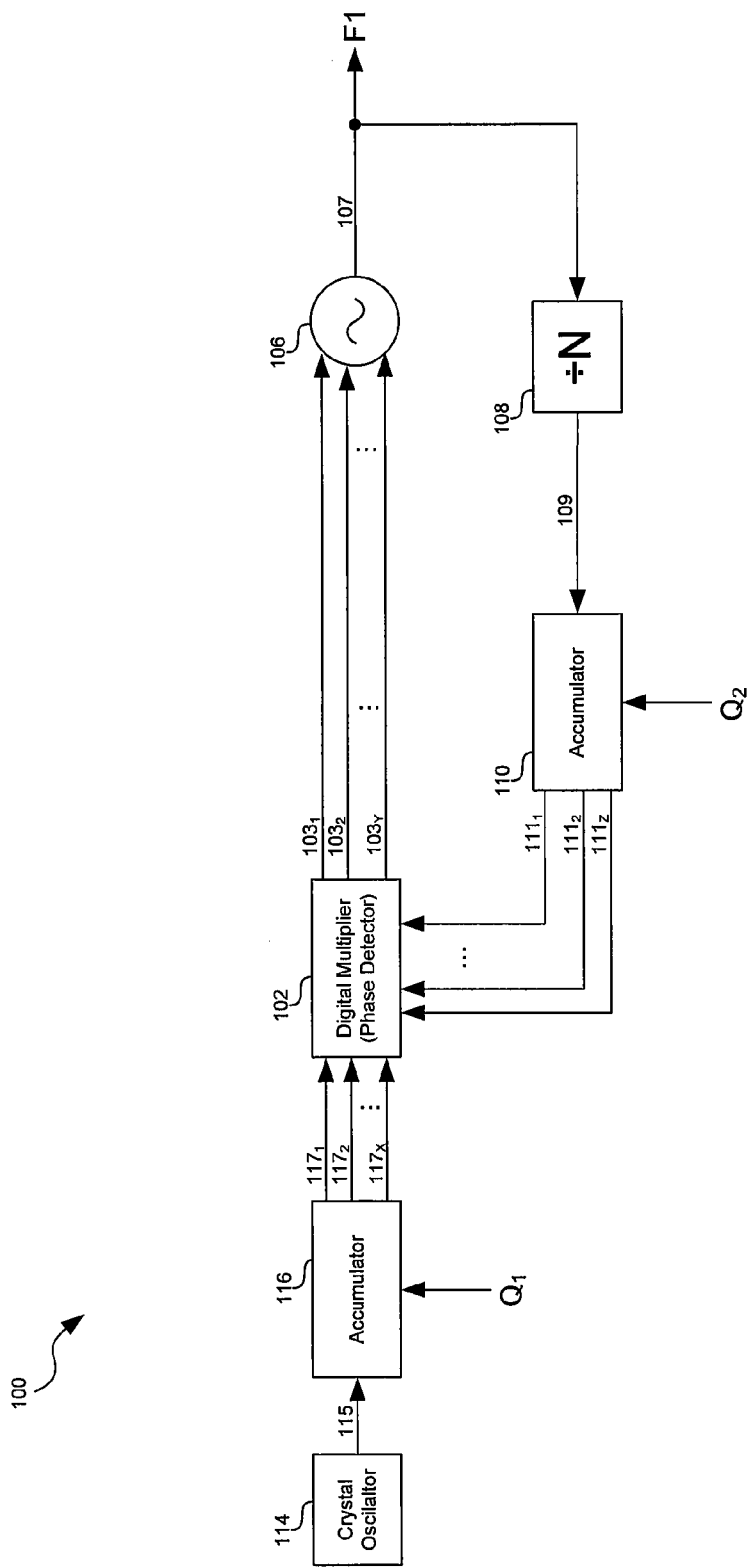
FIG. 1A is a block diagram illustrating an exemplary PLL with an oscillator, in accordance with an embodiment of the invention.

FIG. 1 is a block diagram illustrating an exemplary PLL with an oscillator, in accordance with an embodiment of the invention. Referring to FIG. 1 an exemplary PLL may comprise a crystal oscillator 114, an analog-to-digital converter (A/D) 116, a digital multiplier 102, a filter 104, an oscillator 106, a frequency divider 108, and an accumulator 110.

The crystal oscillator 114 may comprise suitable logic, circuitry, and/or code that may enable generating a stable reference frequency.

The accumulator 116 may comprise suitable logic, circuitry, and/or code that may enable successively adding a control word Q1 to a value stored in the accumulator on each cycle of a reference clock. The accumulator 116 may receive the control word $Q_1$ and a reference signal. In this regard, the control word $Q_1$ and the reference signal may determine a phase and/or a frequency of the output signal 117. In an exemplary embodiment of the invention, the accumulator 116 may be clocked by the crystal oscillator 114. The control word $Q_1$ may be successively added to a value stored in the accumulator 116 on each cycle of the signal 115. In this manner, the sum may eventually be greater than the maximum value the accumulator may store, and the value in the accumulator may overflow or "wrap". Accordingly, an n-bit accumulator may overflow at a frequency $f_o$ given by EQ. 1.

$$f_{116} = f_{115}(Q_1/2^n) \qquad \text{EQ. 1}$$

In this manner, the output of the accumulator 116 may be periodic with period $1/f_{116}$. Additionally, the control word, $Q_1$, may be provided by, for example, the processor 425 of FIG. 4. In this regard, possible values of the control word may be generated based on possible values of the reference frequency 115 and the desired frequency of the signal 107. Values of the control word $Q_1$ may be stored in, for example, a look up table in the memory 427 of FIG. 4.

The digital multiplier 102 may comprise suitable logic, circuitry, and/or code that may enable multiplying the digital signals 111 and 117 and outputting the digital control word 103. An average value of the product of the signals 111 and 117 may be utilized to determine a phase difference between the signals 111 and 117. In this regard, an average product of 0 may indicate the signals 111 and 117 are in-phase, while a non-zero average product may indicate a phase difference between the signals 111 and 117. Accordingly, in instances where the average product of the signals 111 and 117 is not 0, then the signal 103 may be adjusted until the average product is 0, at which point the signal 103 may stabilize.

In various embodiments of the invention, one or more bits of the control word 103 may be delta sigma modulated. In this regard, the signal(s) may be oversampled and the quantization noise may be shaped.

The oscillator 106 may comprise suitable logic, circuitry, and/or code that may enable generating a signal 107 based on the digital control word 103. In this regard, the frequency of the signal 107 may be determined, at least in part, by the digital control word 103.

The frequency divider 108 may comprise suitable logic, circuitry, and/or code for receiving a first, higher frequency and outputting a second, lower frequency. The scaling factor, N, may be determined based on one or more control signals from, for example, the processor 425 of FIG. 4. In this regard, values for the frequency divider may be stored in, for example, a look-up table in the memory 427 of FIG. 4.

The accumulator 110 may comprise suitable logic, circuitry, and/or code that may enable successively adding a digital control word $Q_2$ to a value stored in the accumulator on each cycle of a reference clock. The accumulator 110 may receive the control word $Q_2$ and a reference signal. In this regard, the control word $Q_2$ and the reference signal may determine a phase and/or a frequency of the output signal 111. In an exemplary embodiment of the invention, the accumulator may be clocked by the VCO output 107, or, as depicted in FIG. 1, the signal 109 which may be a divided down version of the VCO output 107. The control word $Q_2$ may be successively added to a value stored in the accumulator on each cycle of the reference clock. In this manner, the sum may eventually be greater than the maximum value the accumulator 110 may store, and the value in the accumulator may overflow or "wrap". Accordingly, an N-bit accumulator will overflow at a frequency $f_o$ given by EQ. 2.

$$f_{110} = f_{109}(Q_2/2^n) \quad \text{EQ. 2}$$

In this manner, the output of the accumulator 110 may be periodic with period $1/f_{110}$. Additionally, the control word, $Q_2$, may be provided by, for example, the processor 425 of FIG. 4. In this regard, possible values of the control word $Q_2$ may be stored in, for example, a look up table in the memory 427 of FIG. 4.

In operation the LOGEN 100 may generate a signal 107 based on the fixed frequency reference signal 115 from the crystal oscillator 114. In this regard, the accumulator 110 may enable generating, based on the signal 109 and the control word $Q_2$, a digital signal 111. The signal 111 may provide feedback such that the oscillator 106 may generate a signal of varying frequency while having the stability of the fixed frequency crystal oscillator 114. In this regard, the multiplier 102 may compare the phase of the signal 117 to the phase of the signal 111 and adjust the value of the control word 103 based on a phase difference between the signals 111 and 117.

Thus, the value of the control word 103 may stabilize when the feedback signal 111 is within a tolerance of the reference signal 117. Accordingly, the output signal 107 of the oscillator 106 may be any integer multiple or fractional multiple of the reference signal 115. In this regard, the signal 111 may be determined using $$f_{111} = \frac{f_{107}}{N} \cdot Q_2 \cdot \frac{1}{2^n} \quad \text{EQ. 3}$$

where $f_{111}$ is the frequency of the signal 111, $f_{107}$ is the frequency of the signal 107, N is the divide ratio of the frequency divider 108, $Q_2$ is the value of the control word input to the accumulator 110, and 'n' is the number of bits of the accumulator 110. Accordingly, the LOGEN 100 may be enabled to generate a wide range of frequencies, with high resolution, without the need of a traditional fractional-N synthesizer.

Figure 1B:
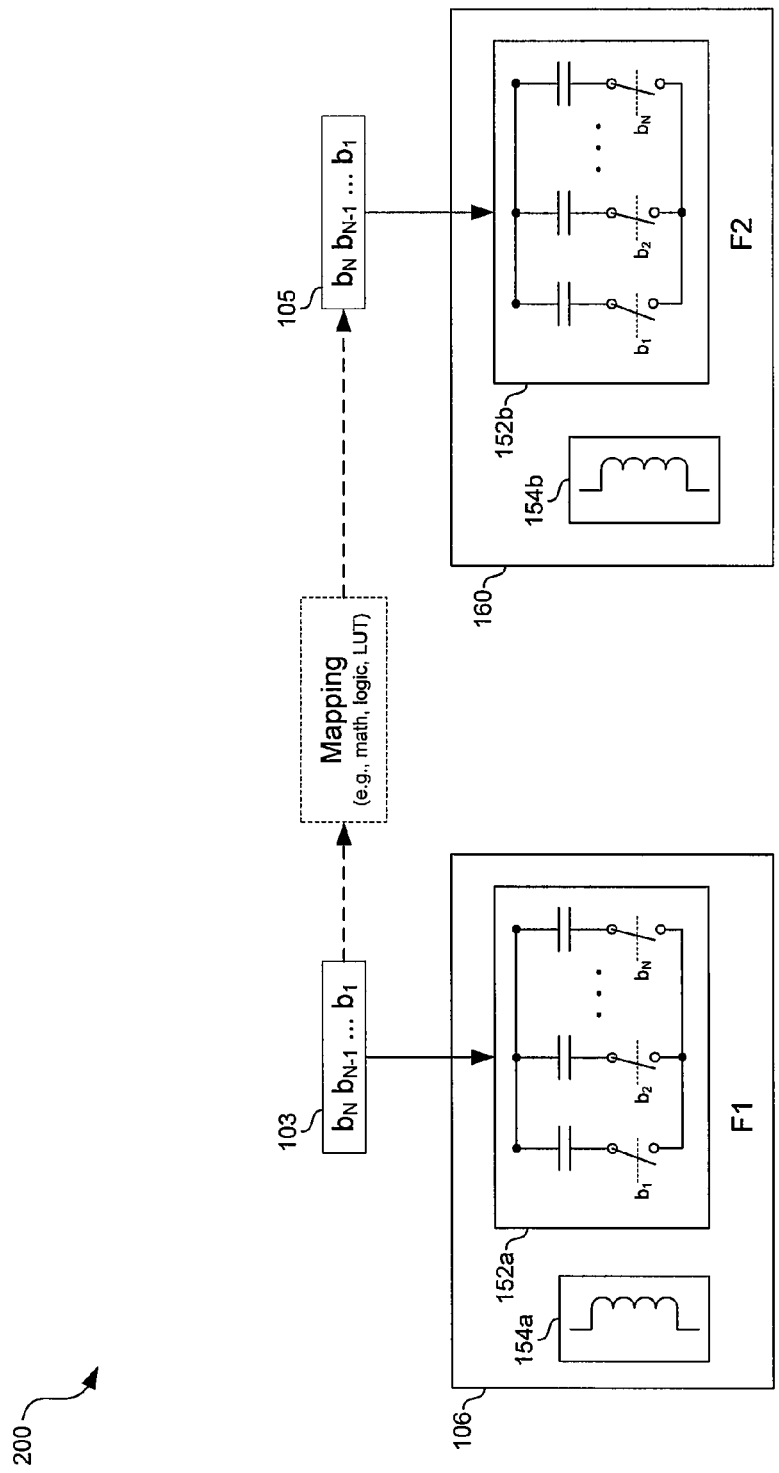
FIG. 1B is a diagram illustrating configuring a tuned circuit based on an oscillator, in accordance with an embodiment of the invention.

FIG. 1B is a diagram illustrating configuration of a tuned circuit based on a oscillator, in accordance with an embodiment of the invention. Referring to FIG. 1B there is shown a simplified block diagram of the oscillator 106 and a tuned circuit 160.

The oscillator 106 may be as described with respect to FIG. 1. The oscillator 106 may comprise a capacitor bank 152a and an inductor 154a. An output frequency, F1, of the oscillator 106 may be determined by the inductor 154 and/or the capacitor bank 152a. In this regard, the inductor 154a may be a fixed inductance and the effective capacitance of the capacitor bank 152a may be variable and controlled via one or more switching elements. Accordingly, the digital control word 103 may be utilized to configure the switching elements of the capacitor bank 152a to control the frequency of the oscillator 106.

In various embodiments of the invention, the frequency F1 output by the oscillator 106 may be determined by $$F1 = \frac{1}{2\pi\sqrt{L_{154a}C_{152a}}} \quad \text{EQ. 4}$$

where $L_{154a}$ may be the inductance of the inductor 154a and $C_{152a}$ may be the effective capacitance of the capacitor bank 152a. Thus, the oscillator 106 may be characterized by the three variables F1, $L_{154a}$, and $C_{152a}$. Accordingly, in instances when two of the three variables may be known, the third variable may be calculated. In this regard, the oscillator 106 may be characterized since the LOGEN 100 may inherently enable accurately measuring and/or verifying the value of F1, for example by phase locking it to a reference signal. Thus, in instances that $L_{154a}$ may be known and F1 may be measured and/or verified, $C_{152a}$ may be calculated and associated with the value of the control word 103 which achieved phase lock.

The tuned circuit 160 may comprise suitable logic, circuitry, and/or code for performing one or more frequency dependant operations. The tuned circuit 160 may comprise an inductor 154b and a capacitor bank 152b. In various exemplary embodiments of the invention, the tuned circuit 160 may be an oscillator, similar to the oscillator 106, which may generate a frequency F2 and/or may be a tunable filter with center frequency F2. In this regard, the capacitor bank 152b and the inductor 154b may determine the frequency F2.

In various embodiments of the invention, the frequency F2 output by the oscillator 106 may be determined by $$F2 = \frac{1}{2\pi\sqrt{L_{154b}C_{152b}}}$$ EQ. 5 where $L_{154b}$ may be the inductance of the inductor 154b and $C_{152b}$ may be the effective capacitance of the capacitor bank 152b. Thus, the tuned circuit 160 may be characterized by the three variables F2, $L_{154b}$, and $C_{152b}$. Accordingly, in instances when two of the three variables may be known, the third variable may be calculated. However, characterizing the tuned circuit 160 may be difficult and/or costly since, for example, measurement and/or verification of the frequency F2 may require additional dedicated circuitry in the system 200 and/or external test equipment. Accordingly, various aspects of the invention may utilize the characteristics of the oscillator 106 to characterize and/or tune the tuned circuit 160, thereby eliminating the additional dedicated circuitry and/or the need for external equipment to characterize the tuned circuit 160.

In various embodiments of the invention, one or more look-up tables may associate a value of the control word 103 with a corresponding effective capacitance $C_{152a}$, and a corresponding frequency F1. Moreover, the look-up table(s) may map between corresponding values of control word 103 and control word 105. In this regard, a mapping between corresponding values of the control word 103 and the control word 105 may be based on a relationship between the oscillator 106 and the tuned circuit 160. For example, a mathematical and/or logical relationship between $C_{152a}$ and $C_{152b}$ and/or between F1 and F2 may be determined during design of the system 200 and the oscillator 106 and/or the tuned circuit 160 may designed such that the relationship may be implemented utilizing suitable logic, circuitry, and/or code. Additionally, effects from process, voltage, and/or temperature variations may be accounted for by the relationship between the oscillator 106 and the tuned circuit 160.

Figure 2:
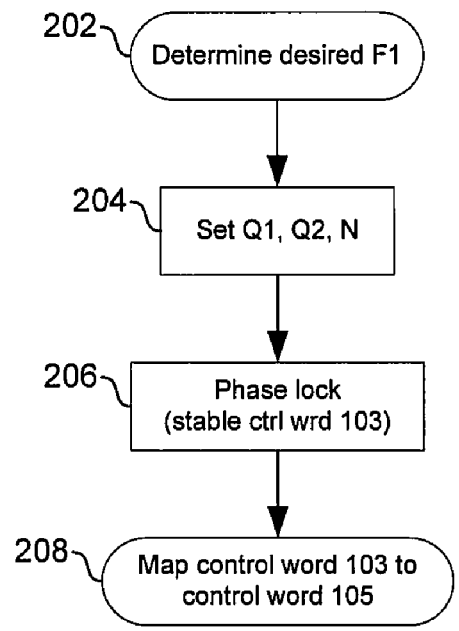
FIG. 2 is a flow chart illustrating exemplary steps for configuring the tuned circuit 160 based on a configuration of the oscillator 106.

FIG. 2 is a flow chart illustrating exemplary steps for configuring the tuned circuit 160 based on a configuration of the oscillator 106. Referring to FIG. 2, the exemplary steps may begin with step 202. In step 202, a desired value of F1 of the oscillator 106 may be determined. In various exemplary embodiments of the invention, F1 may be determined based on a transmit frequency and/or a receive frequency of the system 200. Subsequent to step 202, the exemplary steps may advance to step 204. In step 204, the PLL 100 may be configured in order to generate F1. In this regard, the control words Q1 and Q2 as well as the divide ratio N may be configured based on EQS. 1, 2 and 3 described with respect to FIG. 1A. Subsequent to step 204, the exemplary steps may advance to step 206. In step 206, the PLL 100 may undergo a settling period until control word 103 stabilizes. In this regard, when the control word 103 stabilizes, the PLL 100 may be "locked". Subsequent to step 206, the exemplary steps may advance to step 208. In step 208, the value of the control word 103 which achieved phase lock may be mapped to a corresponding value for control word 105. In this regard, the mapping may comprise one or more mathematical relations, logical relations, and/or one or more look-up tables. In this manner, control word 105 may be configured based on a configuration of the oscillator 106.

Figure 3A:
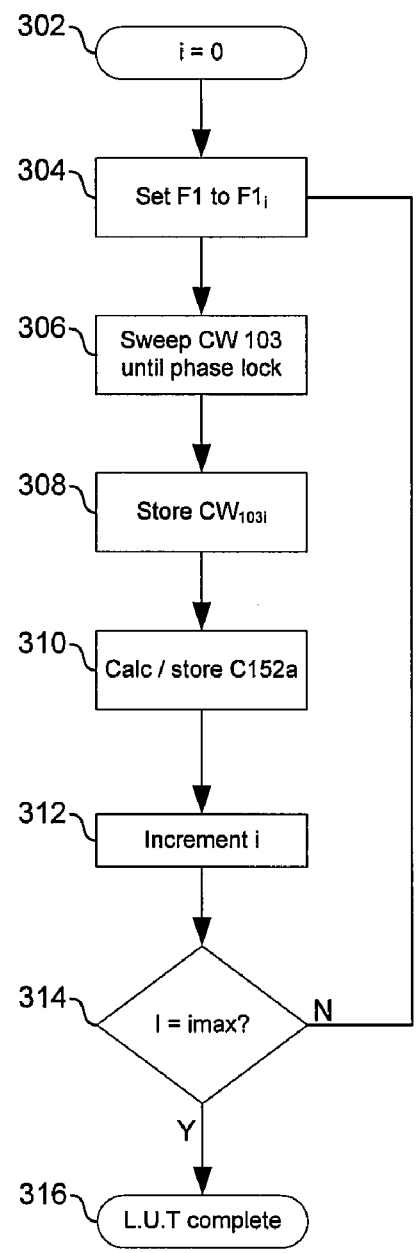
FIG. 3A is a flow chart illustrating exemplary steps for generating a look-up table which may be utilized for configuring the tuned circuit 160 based on characteristics of the oscillator 106, in accordance with an embodiment of the invention.

FIG. 3A is a flow chart illustrating exemplary steps for generating a look-up table which may be utilized for configuring the tuned circuit 160 based on characteristics of the oscillator 106, in accordance with an embodiment of the invention. In this regard, the look-up table may associate a frequency F1 with a corresponding value of the control word 103 and corresponding effective capacitance $C_{152a}$. Referring to FIG. 3A, the exemplary steps may begin with step 302 in which a counter, i, may be initialized to 0. In this regard, the maximum value of i may correspond to the number of values of F1 that may be utilized during operation of the system 200. For example, if F1 is a carrier frequency for a transmitter in the system 200, then i may correspond to the number of channels on which the system 200 may transmit. Subsequent to step 302, the exemplary steps may advance to step 304. In step 304, F1 may be set to a first value, $F1_i$. For example, $F1_i$ may correspond to a lowest frequency channel on which the system 200 may transmit and/or receive signals. Accordingly, Q1, Q2, and N may be set such that the PLL 100 may lock to $F1_i$. Subsequent to step 304, the exemplary steps may advance to step 306.

In step 306, the control word 103 may be adjusted until the PLL 100 achieves lock. For reference, the value of control word 103 which achieves phase lock may be designated $CW_{103i}$. Subsequent to step 306, the exemplary steps may advance to step 308. In step 308, $CW_{103i}$ may be stored to a look-up table in an entry corresponding to $F1_i$. Subsequent to step 308, the exemplary steps may advance to step 310. In step 310, $C_{152a}$ may be calculated utilizing EQ. 4 and may be stored in an entry corresponding to $F1_i$ and/or $CW_{103i}$. Subsequent to step 310, the exemplary steps may advance to step 312. In step 312, the counter i may be incremented. Subsequent to step 312, the exemplary steps may advance to step 314. In step 314, it may be determined whether i may be equal to a maximum value. For example, a maximum value of i may correspond to a highest channel on which the system 200 may transmit and/or receive signals. In instances that i may not be equal to a maximum value, the exemplary steps may return to step 304. In instances that i may be equal to a maximum value, the exemplary steps may advance to step 316 and generation of the look up table may be complete.

Figure 3B:
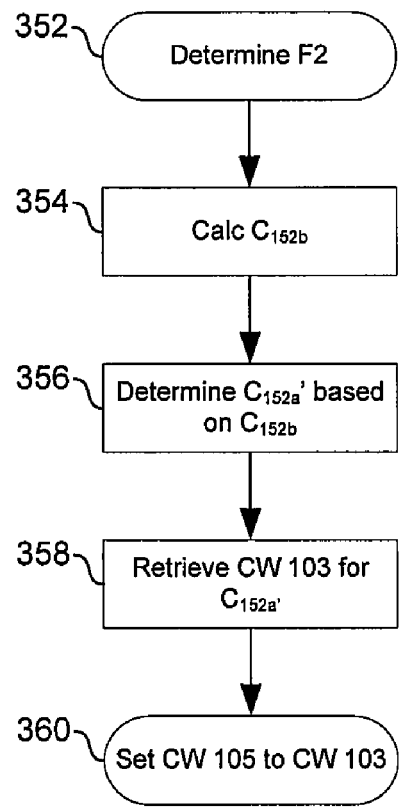
FIG. 3B is a flow chart illustrating exemplary steps for configuring a tuned circuit based on a configuration of an oscillator, in accordance with an embodiment of the invention.

FIG. 3B is a flow chart illustrating exemplary steps for configuring a tuned circuit based on a configuration of an oscillator, in accordance with an embodiment of the invention. Referring to FIG. 3B, the exemplary steps may begin with step 352 when a desired F2 may be determined. Subsequent to step 352, the exemplary steps may advance to step 354. In step 354, EQ. 5 may be utilized to calculate a corresponding $C_{152b}$ which may achieve the value of F2 determined in step 352. Subsequent to step 354, the exemplary steps may advance to step 356. In step 356, a value of $C_{152a}$, referred to herein as C152a', corresponding to the $C_{152b}$ calculated in step 354 may be determined. In this regard, a logical and/or mathematical relationship between the capacitor banks 152a and 152b may be utilized to calculate $C_{152a}'$. Subsequent to step 356, the exemplary steps may advance to step 358. In step 358, a look-up table may be referenced to determine a value of the control word 103 which may correspond to the effective capacitance $C_{152a}'$. In this regard, the look-up table may have been generated in a manner similar to, or the same as described with respect to FIG. 3A. Subsequent to step 358, the exemplary steps may advance to step 360. In step 360, the value of the control word 105 may be set equal to the value of the control word 103 retrieved in step 358. In this manner, a desired F2 may be achieved based on a characterization of the oscillator 106 and a relationship between $C_{152a}$ and $C_{152b}$.

Figure 4:
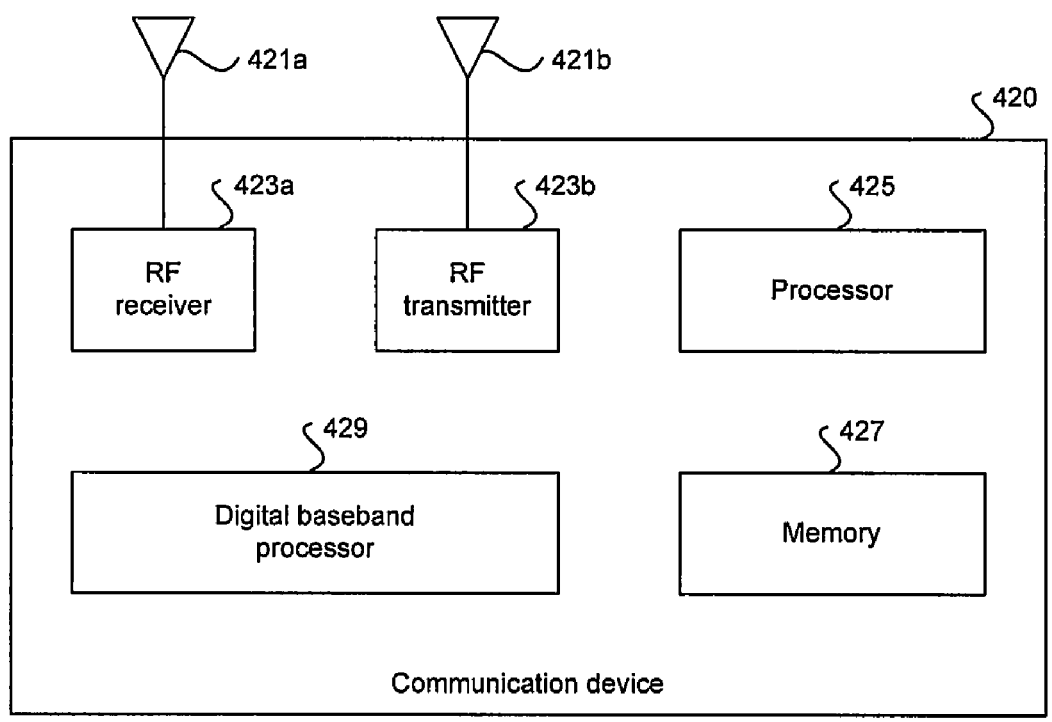
FIG. 4 is a block diagram illustrating an exemplary RF communication device, in accordance with an embodiment of the invention.

FIG. 4 is a block diagram illustrating an exemplary RF communication device, in accordance with an embodiment of the invention. Referring to FIG. 4, there is shown a RF communication device 420 that may comprise an RF receiver 423a, an RF transmitter 423b, a digital baseband processor 429, a processor 425, and a memory 427. A receive antenna 421a may be communicatively coupled to the RF receiver 423a. A transmit antenna 421b may be communicatively coupled to the RF transmitter 423b. The RF communication device 420 may be operated in a system, such as the cellular network and/or digital video broadcast network, for example.

The RF receiver 423a may comprise suitable logic, circuitry, and/or code that may enable processing of received RF signals. In this regard, the receiver may be enabled to generate signals, such as local oscillator signals, for the reception and processing of RF signals. In this regard, the receiver 423a may comprise one or more circuits similar to or the same as the oscillator 106 and/or the tuned circuit 160. The RF receiver 423a may down-convert received RF signals to a baseband frequency signal. The RF receiver 423a may perform direct down-conversion of the received RF signal to a baseband frequency signal, for example. In some instances, the RF receiver 423a may enable analog-to-digital conversion of the baseband signal components before transferring the components to the digital baseband processor 429. In other instances, the RF receiver 423a may transfer the baseband signal components in analog form.

The digital baseband processor 429 may comprise suitable logic, circuitry, and/or code that may enable processing and/or handling of baseband frequency signals. In this regard, the digital baseband processor 429 may process or handle signals received from the RF receiver 423a and/or signals to be transferred to the RF transmitter 423b. The digital baseband processor 429 may also provide control and/or feedback information to the RF receiver 423a and to the RF transmitter 423b based on information from the processed signals. In this regard, the baseband processor 429 may provide one or more control signals to, for example, the accumulator 114, the multiplier 102, the filter 104, the oscillator 106, the frequency divider 108, the accumulator 110, and/or the tuned circuit 160. The digital baseband processor 429 may communicate information and/or data from the processed signals to the processor 425 and/or to the memory 427. Moreover, the digital baseband processor 429 may receive information from the processor 425 and/or to the memory 427, which may be processed and transferred to the RF transmitter 423b for transmission to the network.

The RF transmitter 423b may comprise suitable logic, circuitry, and/or code that may enable processing of RF signals for transmission. In this regard, the transmitter may be enabled to generate signals, such as local oscillator signals, for the transmission and processing of RF signals. In this regard, the receiver 423a may comprise one or more circuits similar to or the same as the oscillator 106 and/or the tuned circuit 160. The RF transmitter 423b may up-convert the baseband frequency signal to an RF signal. The RF transmitter 423b may perform direct up-conversion of the baseband frequency signal to a RF signal, for example. In some instances, the RF transmitter 423b may enable digital-to-analog conversion of the baseband signal components received from the digital baseband processor 429 before up conversion. In other instances, the RF transmitter 423b may receive baseband signal components in analog form.

The processor 425 may comprise suitable logic, circuitry, and/or code that may enable control and/or data processing operations for the RF communication device 420. The processor 425 may be utilized to control at least a portion of the RF receiver 423a, the RF transmitter 423b, the digital baseband processor 429, and/or the memory 427. In this regard, the processor 425 may generate at least one signal for controlling operations within the RF communication device 420.

In this regard, the baseband processor 429 may provide one or more control signals to, for example, the accumulator 114, the multiplier 102, the filter 104, the oscillator 106, the frequency divider 108, the accumulator 110, and/or the tuned circuit 160. The processor 425 may also enable executing of applications that may be utilized by the RF communication device 420. For example, the processor 425 may execute applications that may enable displaying and/or interacting with content received via RF signals in the RF communication device 420.

The memory 427 may comprise suitable logic, circuitry, and/or code that may enable storage of data and/or other information utilized by the RF communication device 420. For example, the memory 427 may be utilized for storing processed data generated by the digital baseband processor 429 and/or the processor 425. The memory 427 may also be utilized to store information, such as configuration information, that may be utilized to control the operation of at least one block in the RF communication device 420. For example, the memory 427 may comprise information necessary to configure the RF receiver 423a to enable receiving signals in the appropriate frequency band. In this regard, the memory 427 may store configuration and/or control information for the accumulator 114, the multiplier 102, the filter 104, the oscillator 106, the frequency divider 108, the accumulator 110, and/or the tuned circuit 160.

In operation, a tuned circuit 160 in the communication device 420 may be configured based on a configuration of an oscillator 106 in the communication device 420. In this regard, a frequency F2 for the tuned circuit 160 may be determined via a user input and/or one or more algorithms executed by the processor 425, the memory 417, and/or the baseband processor 429. Subsequently an appropriate value of $C_{152b}$ to achieve F2 may be determined. In this regard, the processor 425 may utilize a logical and/or mathematical relationship between F2 and $C_{152b}$, and/or the processor 425 may access a look-up table stored in the memory 425. After calculating $C_{152b}$, a corresponding value of $C_{152a}$ (referred to herein as $C_{152a}'$) may be determined. In this regard, the processor 425 may utilize a mathematical and/or logical relationship between $C_{152a}$ and $C_{152b}$, and/or may access a look-up table in the memory 427. Next, the processor 425 may access a look-up table in the memory 427 to determine a value of the control word 103 that may correspond to the capacitance $C_{152a}'$ and the control word 105 may be set equal to the retrieved value.

Aspects of a method and system for frequency tuning based on characterization of an oscillator are provided. In this regard, a frequency of the oscillator 106 in an integrated circuit may be controlled based on the digital control word 103, a frequency of a tuned circuit 160 may be controlled based on the digital control word 105, and the control word 105 may be determined utilizing a mapping between the control word 103 and the control word 105. The frequency of the oscillator 106 and the tuned circuit 160 may be controlled by adjusting a capacitance of the oscillator and tuned circuit, respectively. The capacitance may be adjusted via a configurable bank of capacitors 152. The frequency of the oscillator may be measured and/or verified via the phase locked loop 100. The mapping may be based on a relationship between the oscillator 106 and the tuned circuit 160, such as a logical and/or mathematical relationship between the capacitance of the oscillator and the capacitance of the tuned circuit and/or the relationship between the frequency F1 of the oscillator and the frequency F2 of the tuned circuit. One or more look-up tables may be utilized to implement the mapping between the digital control word 103 and the digital control word 105.

In various embodiments of the invention, the tuned circuit 160 may be an oscillator or a filter.

Another embodiment of the invention may provide a machine-readable storage, having stored thereon, a computer program having at least one code section executable by a machine, thereby causing the machine to perform the steps as described herein for frequency tuning based on characterization of an oscillator.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
controlling a frequency of an oscillator in an integrated circuit by adjusting a capacitance of said oscillator based on a first digital control word;
determining a second digital control word utilizing a mapping between said first digital control word and said second digital control word, wherein said mapping is based on a relationship between said oscillator and a tuned circuit in said integrated circuit; and
controlling a frequency of said tuned circuit by adjusting a capacitance of said tuned circuit based on said second digital control word.

2. The method according to claim 1, comprising measuring and/or verifying said frequency of said oscillator via a phase locked loop.

3. The method according to claim 1, wherein said mapping is based on a logical and/or mathematical relationship between said capacitance of said oscillator and said capacitance of said tuned circuit.

4. The method according to claim 1, wherein said mapping is based on a logical and/or mathematical relationship between said frequency of said oscillator and said frequency of said tuned circuit.

5. The method according to claim 1, comprising adjusting said capacitance of said oscillator via a configurable bank of capacitors.

6. The method according to claim 1, comprising adjusting said capacitance of said tuned circuit via a configurable bank of capacitors.

7. The method according to claim 1, comprising utilizing one or more look-up tables to implement said mapping between said first digital control word and said second control word.

8. The method according to claim 1, wherein said tuned circuit comprises a filter.

9. The method according to claim 1, wherein said tuned circuit comprises an oscillator.

10. A machine-readable storage having stored thereon, a computer program having at least one code section for signal processing, the at least one code section being executable by a machine for causing the machine to perform steps comprising:
controlling a frequency of an oscillator in an integrated circuit by adjusting a capacitance of said oscillator based on a first digital control word;
determining a second digital control word utilizing a mapping between said first digital control word and said second digital control word, wherein said mapping is based on a relationship between said oscillator and a tuned circuit in said integrated circuit; and
controlling a frequency of said tuned circuit by adjusting a capacitance of said tuned circuit based said second digital control word.

11. The machine-readable storage according to claim 10, wherein said at least one code section comprises code for measuring and/or verifying said frequency of said oscillator via a phase locked loop.

12. The machine-readable storage according to claim 10, wherein said mapping is based on a logical and/or mathematical relationship between said capacitance of said oscillator and said capacitance of said tuned circuit.

13. The machine-readable storage according to claim 10, wherein said mapping is based on a logical and/or mathematical relationship between said frequency of said oscillator and said frequency of said tuned circuit.

14. The machine-readable storage according to claim 10, wherein said at least one code section comprises code for adjusting said capacitance of said oscillator via a configurable bank of capacitors.

15. The machine-readable storage according to claim 10, wherein said at least one code section comprises code for adjusting said capacitance of said tuned circuit via a configurable bank of capacitors.

16. The machine-readable storage according to claim 10, wherein said at least one code section comprises code for utilizing one or more look-up tables to implement said mapping between said first digital control word and said second control word.

17. The machine-readable storage according to claim 10, wherein said tuned circuit comprises a filter.

18. The machine-readable storage according to claim 10, wherein said tuned circuit comprises an oscillator.

19. A system for signal processing, the system comprising:
in an integrated circuit comprising an oscillator and a tuned circuit, one or more circuits that operate to, at least:
control a frequency of said oscillator by adjusting a capacitance of said oscillator based on a first digital control word;
determine a second digital control word utilizing a mapping between said first digital control word and said second digital control word, wherein said mapping is based on a relationship between said oscillator and said tuned circuit; and control a frequency of said tuned circuit by adjusting a capacitance of said tuned circuit based on said second digital control word.

20. The system according to claim 19, wherein said one or more circuits measure and/or verify said frequency of said oscillator via a phase locked loop.

21. The system according to claim 19, wherein said mapping is based on a logical and/or mathematical relationship between said capacitance of said oscillator and said capacitance of said tuned circuit.

22. The system according to claim 19, wherein said mapping is based on a logical and/or mathematical relationship between said frequency of said oscillator and said frequency of said tuned circuit.

23. The system according to claim 19, wherein said oscillator comprises a configurable bank of capacitors and said capacitance of said oscillator is adjusted via one or more switching elements of said configurable bank of capacitors.

24. The system according to claim 19, wherein said tuned circuit comprises a configurable bank of capacitors and said capacitance of said tuned circuit is adjusted via one or more switching elements of said configurable bank of capacitors.

25. The system according to claim 19, wherein said one or more circuits comprise one or more memory elements enabled to store one or more look-up tables, and said one or more look-up tables are utilized to implement said mapping between said first digital control word and said second control word.

26. The system according to claim 19, wherein said tuned circuit comprises a filter.

27. The system according to claim 19, wherein said tuned circuit comprises an oscillator.

* * * * *